(12) United States Patent
Zhao et al.

(10) Patent No.: US 10,388,344 B2
(45) Date of Patent: Aug. 20, 2019

(54) DATA WRITING METHOD OF MAGNETIC MEMORY

(71) Applicant: BEIHANG UNIVERSITY, Beijing (CN)

(72) Inventors: Weisheng Zhao, Beijing (CN); Zhaohao Wang, Beijing (CN); Mengxing Wang, Beijing (CN); Wenlong Cai, Beijing (CN)

(73) Assignee: BEIHANG UNIVERSITY, BeiJing (CN)

( * ) Notice: Subject to any disclaimer, the term of this patent is extended or adjusted under 35 U.S.C. 154(b) by 0 days.

(21) Appl. No.: 15/989,190

(22) Filed: May 25, 2018

(65) Prior Publication Data
US 2018/0277184 A1    Sep. 27, 2018

(30) Foreign Application Priority Data
Mar. 7, 2018    (CN) .......................... 2018 1 0186489

(51) Int. Cl.
G11C 11/16    (2006.01)
H01L 27/22    (2006.01)
G11C 11/15    (2006.01)

(52) U.S. Cl.
CPC ............ G11C 11/161 (2013.01); G11C 11/15 (2013.01); G11C 11/1675 (2013.01); H01L 27/226 (2013.01); H01L 27/222 (2013.01)

(58) Field of Classification Search
CPC .......................... G11C 11/16; G11C 11/1675
USPC .................................................. 365/158, 173
See application file for complete search history.

(56) References Cited

U.S. PATENT DOCUMENTS

| | | | | |
|---|---|---|---|---|
| 9,508,925 B2* | 11/2016 | Pi | ............................ | H01L 43/10 |
| 9,647,032 B2* | 5/2017 | Wang | .................... | H01L 27/228 |
| 9,691,458 B2* | 6/2017 | Ralph | ..................... | G11C 11/18 |
| 10,008,248 B2* | 6/2018 | Buhrman | ................ | H01L 43/08 |
| 10,102,893 B2* | 10/2018 | Lee | ........................ | G11C 11/161 |
| 10,102,956 B2* | 10/2018 | Cros | ..................... | H01F 10/324 |
| 10,103,199 B2* | 10/2018 | Daibou | ................. | G11C 11/161 |
| 10,103,317 B2* | 10/2018 | Hu | ........................ | H01L 43/02 |
| 10,193,061 B2* | 1/2019 | Shiokawa | ............... | H01F 10/30 |
| 10,211,393 B2* | 2/2019 | Mihajlovic | ............. | H01L 43/08 |
| 10,229,723 B1* | 3/2019 | Choi | ...................... | G11C 11/14 |
| 2018/0061482 A1* | 3/2018 | Zhao | ..................... | G11C 11/161 |
| 2019/0035447 A1* | 1/2019 | Zhao | ..................... | G11C 11/161 |

* cited by examiner

*Primary Examiner* — Michael T Tran

(57) ABSTRACT

A magnetic memory includes one or more magnetic tunnel junctions, a heavy metal or anti-ferromagnetic strip film, a first bottom electrode and a second bottom electrode. Every magnetic tunnel junction is located on the strip film and represents a memory cell; the first bottom electrode and the second bottom electrode are respectively connected with two ends of the heavy metal or anti-ferromagnetic strip film; every magnetic tunnel junction includes a first ferromagnetic metal, a first oxide, a second ferromagnetic metal, a first synthetic antiferromagnetic layer and an $X^{th}$ top electrode from bottom to top in sequence, wherein X is a serial number of the memory cell. A data writing method combines spin orbit torque with spin transfer torque to write data, and respectively applies two currents to the magnetic tunnel junction and the heavy metal or anti-ferromagnetic strip film. Only one current is unable to complete data writing.

4 Claims, 7 Drawing Sheets

DATA WRITING METHOD OF MAGNETIC MEMORY

CROSS REFERENCE OF RELATED APPLICATION

The present invention claims priority under 35 U.S.C. 119(a-d) to CN 201810186489.4, filed Mar. 7, 2018.

BACKGROUND OF THE PRESENT INVENTION

Field of Invention

The present invention relates to a data writing method of a magnetic memory, which belongs to the field of non-volatile storage and logic technology.

Description of Related Arts

The emerging non-volatile memory technology is one of the effective solutions to resolve the problem of high static power consumption of integrated circuits in deep sub-micron era. Due to high-speed read and write, low write current, almost unlimited write endurance, and good process compatibility, the MRAM (Magnetic Random Access Memory) based on MTJ (magnetic tunnel junction) is expected to become the next generation of the universal non-volatile memory. For a long time, the write mechanism has been the main technical bottleneck restricting the development of MRAM. Early MRAMs used magnetic fields to write data. However, in order to generate the suitable magnetic field, the write current with the order of milliampere is usually required, and the power consumption is high. Moreover, with the scaling of the memory cell MTJ, the current needed by the field-induced writing operation is difficult to be reduced accordingly, which is disadvantageous to the realization of high-density MRAM. Therefore, the purely electrical writing method is gradually adopted by the emerging MRAM.

At present, the electrical writing method of the MRAM mainly includes the STT (spin transfer torque) and the SOT (spin orbit torque). Commercialization of STT-MRAM has been gradually realized, and that of SOT-MRAM is still at an academic stage. These two writing methods have own advantages and disadvantages, and are difficult to be the perfect universal solution. The STT-MRAM requires only one bidirectional current for the write operation, but the write current passes through the oxide barrier layer, which is likely to cause device breakdown, and the write current and the read current share the same path, so that the read performance and the write performance are influenced from each other. Moreover, the write operation of the STT-MRAM is mainly triggered by thermal fluctuations, requires a long incubation delay, so that the write speed is limited. The SOT-MRAM is able to separate the read path from the write path, which reduces the risk of barrier breakdown and facilitates the independent optimization of the read performance and the write performance. However, the memory cell of SOT-MRAM has three terminals, and usually requires two access transistors, which severely limits the storage density.

SUMMARY OF THE PRESENT INVENTION

In view of the problems faced by the writing method of the magnetic random access memory mentioned in the above background, and especially the drawbacks of spin transfer torque and spin orbit torque in device reliability, write power consumption and storage density, the present invention provides a new data writing method of a magnetic memory, which combines the advantages of spin transfer torque and spin orbit torque to solve the above drawbacks and optimize the performance of the memory.

Accordingly, the present invention provides technical solutions as follows.

A data writing method of a magnetic memory is provided, wherein the magnetic memory comprises one or more magnetic tunnel junctions, a heavy metal or anti-ferromagnetic strip film, a first bottom electrode and a second bottom electrode, wherein every magnetic tunnel junction is located on the heavy metal or anti-ferromagnetic strip film and represents a memory cell, the first bottom electrode and the second bottom electrode are respectively connected with two ends of the heavy metal or anti-ferromagnetic strip film, every magnetic tunnel junction comprises a first ferromagnetic metal, a first oxide, a second ferromagnetic metal, a first synthetic antiferromagnetic layer and an $X^{th}$ top electrode from bottom to top in sequence, here X is a serial number of the memory cell represented by a corresponding magnetic tunnel junction.

Preferably, a resistance of every magnetic tunnel junction is dependent on a magnetization direction of the first ferromagnetic metal and the second ferromagnetic metal; if the magnetization direction of the first ferromagnetic metal is as same as the magnetization direction of the second ferromagnetic metal, the resistance of every magnetic tunnel junction is smaller and in this case every magnetic tunnel junction is in a low-resistance state; conversely, if the magnetization direction of the first ferromagnetic metal is opposite to the magnetization direction of the second ferromagnetic metal, the resistance of every magnetic tunnel junction is larger and in this case every magnetic tunnel junction is in a high-resistance state.

Preferably, the magnetization direction of the second ferromagnetic metal is pinned, and the magnetization direction of the first ferromagnetic metal is able to be changed through write operations.

Preferably, the data writing method is based on the spin orbit torque effect and the spin transfer torque effect, wherein the spin orbit torque is produced through applying a current to the heavy metal or anti-ferromagnetic strip film, the spin transfer torque is produced through applying a current to the magnetic tunnel junction.

Take the write process of the $X^{th}$ magnetic tunnel junction as an example, and the data writing method of the magnetic memory provided by the present invention comprises steps of:

(1) applying a current, called as a spin orbit torque write current, between the first bottom electrode and the second bottom electrode, producing a spin orbit torque, disturbing magnetization states of the first ferromagnetic metals of all the magnetic tunnel junctions through the spin orbit torque, wherein the magnetization states are unable to be switched since the spin orbit torque write current is smaller than the switching threshold;

(2) according to a data value to be written, applying a current, called as a spin transfer torque write current, between the first bottom electrode and the $X^{th}$ top electrode, or between the $X^{th}$ top electrode and the second bottom electrode, producing a spin transfer torque, writing the data value based on a magnetization direction of the first ferromagnetic metal of the $X^{th}$ magnetic tunnel junction under an action of the spin transfer torque, wherein a state of the written data value is dependent on a direction of the spin transfer torque write current;

(3) removing the spin orbit torque write current, remaining the spin transfer torque write current, and continuing to complete reliable writing through the remained spin transfer torque write current; and (4) removing the spin transfer torque write current, wherein the magnetization direction of the first ferromagnetic metal of the $X^{th}$ magnetic tunnel junction is changed or unchanged, a resistance of the $X^{th}$ magnetic tunnel junction is correspondingly changed or unchanged, resistances of other magnetic tunnel junctions are unchanged, and completing writing.

It can be seen from the above processes that, the data writing method of the magnetic memory provided by the present invention requires two currents to complete a complete write operation. It is worth emphasizing that the above two currents (the spin orbit torque write current and the spin transfer torque write current) must be smaller than respective switching thresholds. Therefore, if one and only one of the two currents is used, the magnetization direction of the first ferromagnetic metal of the magnetic tunnel junction will only produce slight disturbances but will not be switched, and the resistance of the magnetic tunnel junction will not be changed. If the magnetization direction of the first ferromagnetic metal of a magnetic tunnel junction is to be changed, the above two currents must be used simultaneously to complete the data writing operation of the magnetic tunnel junction.

Compared with the existing spin orbit torque writing method and the spin transfer torque writing method, the data writing method of the magnetic memory provided by the present invention has advantages as follows.

In the present invention, multiple magnetic tunnel junctions are manufactured on a heavy metal or anti-ferromagnetic strip film; compared with the spin orbit torque magnetic memory using three-terminal magnetic tunnel junctions, the magnetic memory provided by the present invention reduces an amount of access transistors, which is beneficial to improving integration density.

In the present invention, the current for producing the spin transfer torque is much smaller than the current adopted by the existing spin transfer torque magnetic memory, due to the assisting effect of the spin orbit torque. Therefore, in the present invention, the current flowing through the magnetic tunnel junction is significantly reduced, so that the risk of barrier breakdown is reduced, which is beneficial to improving the device reliability.

Due to elimination of incubation delay, the data write speed of the data writing method provided by the present invention is higher than that of the existing spin transfer torque writing method. According to the present invention, while the writing operation is performed, the magnetization direction of the first ferromagnetic metal of the magnetic tunnel junction is disturbed by the spin orbit torque, so that the spin transfer torque effect becomes stronger, the magnetization direction is able to be quickly switched without the incubation delay.

In the present invention, the write current is easy to be controlled; it is only ensured that the needed two currents have sufficient overlap in time and there are no strict requirements for the rise time and the fall time of the current pulse.

BRIEF DESCRIPTION OF THE DRAWINGS

FIGS. 9-1 and 9-2 are signal waveform diagrams and resistance variation diagrams of the magnetic tunnel junction shown in FIG. 8, wherein FIG. 9-1 shows a waveform diagram and resistance variation diagrams of the magnetic tunnel junction in high-resistance initial state, and FIG. 9-2 shows a waveform diagram and resistance variation diagrams of the magnetic tunnel junction in low-resistance initial state.

FIGS. 11-1 and 11-2 are signal waveform diagrams and resistance variation diagrams of the magnetic tunnel junction shown in FIG. 10, wherein FIG. 11-1 shows a waveform diagram and resistance variation diagrams of the magnetic tunnel junction in low-resistance initial state, and FIG. 11-2 shows a waveform diagram and resistance variation diagrams of the magnetic tunnel junction in high-resistance initial state.

Figure 1:
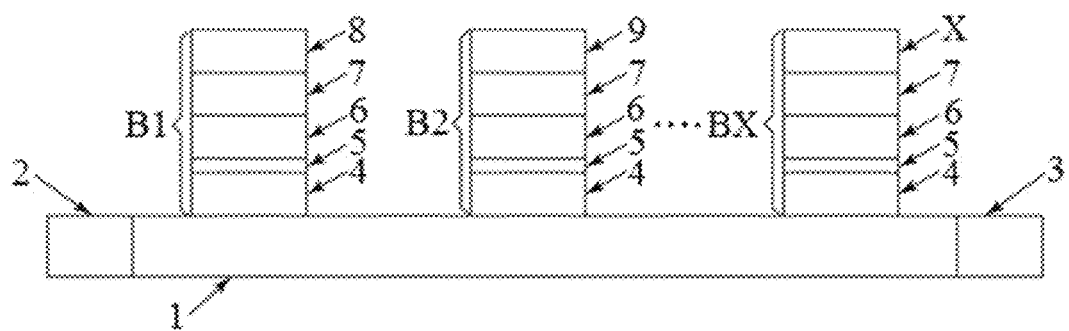
FIG. 1 is a structurally schematic view of a magnetic memory provided by the present invention.

In the drawings, 1: heavy metal or anti-ferromagnetic strip film; 2: first bottom electrode; 3: second bottom electrode; 4: first ferromagnetic metal; 5: first oxide; 6: second ferromagnetic metal; 7: first synthetic antiferromagnetic layer; 8: first top electrode; 9: second top electrode; X: $X^{th}$ top electrode; W1: write branch between the first bottom electrode and the second bottom electrode; W2: write branch between the first bottom electrode and the second top electrode; W3: write branch between the second bottom electrode and the second top electrode; $I_1$: write current from the first bottom electrode to the second bottom electrode; $I_2$: write current from the first bottom electrode to the second top electrode; $I_3$: write current from the first bottom electrode to the second bottom electrode; $I_4$: write current from the first bottom electrode to the second top electrode; $I_5$: write current from the first bottom electrode to the second bottom electrode; $I_6$: write current from the second top electrode to the second bottom electrode; B1: first magnetic tunnel junction; B2: second magnetic tunnel junction; BX: $X^{th}$ magnetic tunnel junction; $R_{B1}$: resistance of the first magnetic tunnel junction; $R_{B2}$: resistance of the second magnetic tunnel junction; $R_{BX}$: resistance of the $X^{th}$ magnetic tunnel junction; t: time; $t_1$: corresponding time (wherein i=1, 2, 3 . . . 14); $R_H$: maximum resistance of magnetic tunnel junction; $R_L$: minimum resistance of magnetic tunnel junction; $I_{C\_SOT}$: needed write current threshold when the magnetic tunnel junction is written only through a spin orbit torque; $I_{C\_STT}$: needed write current threshold when the magnetic tunnel junction is written only through a spin transfer torque.

DETAILED DESCRIPTION OF THE PREFERRED EMBODIMENT

The substantive features of the present invention will be further described with reference to the drawings. The drawings are schematic diagrams in which the thicknesses of various functional layers or regions involved are not actual sizes, and the resistances and current values in the operating mode are also not actual values.

Detailed embodiments are disclosed herein, and specific structural details and functional details thereof merely indicate the purpose of the embodiments. Therefore, the present invention may be implemented in many alternative forms, and the present invention should not be limited to the embodiments set forth herein but should cover all changes, equivalents, and alternatives falling within the protective scope of the present invention.

The present invention provides a data writing method of a magnetic memory which is adapted for not only the magnetic random access memory but the magnetic logic circuit.

FIG. 1 is a structurally schematic view of a magnetic memory provided by the present invention.

The magnetic memory comprises multiple magnetic tunnel junctions B1-BX (which are respectively a first magnetic tunnel junction B1, a second magnetic tunnel junction B2, . . . , a $X^{th}$ magnetic tunnel junction BX), and a heavy metal or anti-ferromagnetic strip film 1, wherein a first bottom electrode 2 and a second bottom electrode 3 are respectively connected with two ends of the heavy metal or anti-ferromagnetic strip film 1, the magnetic tunnel junctions B1-BX are located on the heavy metal or anti-ferromagnetic strip film 1, every magnetic tunnel junction represents a memory cell.

Each of the magnetic tunnel junctions B1-BX comprises five layers of materials, that is, a first ferromagnetic metal 4, a first oxide 5, a second ferromagnetic metal 6, a first synthetic antiferromagnetic layer 7 and one of a first top electrode 8, a second top electrode 9, . . . and a $X^{th}$ top electrode X.

The magnetic memory provided by the present invention is prepared through a processing technology of a traditional nanometer device, which comprises steps of depositing the five layers of materials on a substrate in an order from bottom to top through conventional molecular beam epitaxy, atomic layer deposition or magnetron sputtering, and then etching.

The magnetic memory provided by the present invention is integrated through back-end semiconductor manufacturing process.

Preferably, a thickness of the heavy metal or anti-ferromagnetic strip film 1 is in a range of 0-20 nm.

Preferably, the heavy metal or anti-ferromagnetic strip film 1 is rectangular, a top area of the heavy metal or anti-ferromagnetic strip film 1 is larger than a bottom area of the magnetic tunnel junctions B1-BX, and a bottom surface of the magnetic tunnel junctions B1-BX is completely confined within a top surface of the heavy metal or anti-ferromagnetic strip film 1.

Preferably, the magnetic tunnel junctions B1-BX are square, rectangular (with any aspect ratio), round or oval (with any aspect ratio).

Preferably, a thickness of the first ferromagnetic metal 4 is in a range of 0-3 nm, a thickness of the first oxide 5 is in a range of 0-2 nm, a thickness of the second ferromagnetic metal 6 is in a range of 0-3 nm, a thickness of the first synthetic antiferromagnetic layer 7 is in a range of 0-20 nm, a thickness of the first top electrode 8, the second top electrode 9, . . . , or the $X^{th}$ top electrode X is in a range of 1-200 nm.

Preferably, the heavy metal strip film 1 is made from Pt, Ta or W.

Preferably, the anti-ferromagnetic strip film 1 is made from a compound IrMn or PtMn, wherein proportions of elements in the compounds may be different.

Preferably, the first top electrode 8, the second top electrode 9, . . . , and the $X^{th}$ top electrode X are made from Ta, Al or Cu.

Preferably, the first bottom electrode 2 is made from Ta, Al or Cu.

Preferably, the second bottom electrode 3 is made from Ta, Al or Cu.

Preferably, the first ferromagnetic metal 4 is made from CoFe, CoFeB or NiFe, wherein proportions of elements in the compounds may be different.

Preferably, the first oxide 5 is made from MgO or $Al_2O_3$ for producing tunneling magnetoresistance effect.

Preferably, the second ferromagnetic metal 6 is made from CoFe, CoFeB or NiFe, wherein proportions of elements in the compounds may be different.

Preferably, the first synthetic antiferromagnetic layer 7 is a mixed layer which is made from Ta/[Co/Pt]$_n$/Ru/[Co/Pt]$_m$, Ta/[Co/Pd]$_n$/Ru/[Co/Pd]$_m$, Ru/CoFe/PtMn, Ru/CoFeB/PtMn, Ru/CoFe/IrMn, or Ru/CoFeB/IrMn, wherein proportions of elements in the compounds may be different and values of m and n can be different.

Figure 2:
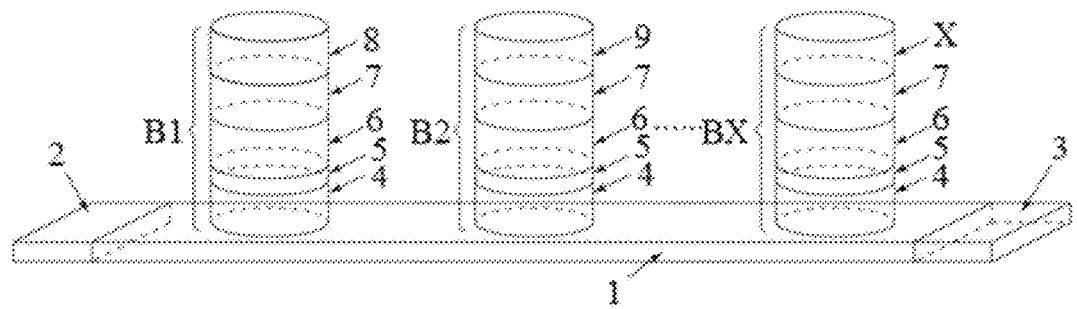
FIG. 2 is a structurally schematic view of a magnetic memory, in which round magnetic tunnel junctions are taken as an example, provided by the present invention.

FIG. 2 is a structurally schematic view of a magnetic memory, in which round magnetic tunnel junctions are taken as an example, provided by the present invention.

In FIG. 2, the magnetic tunnel junctions B1-BX are round and are also able to be square and rectangular (with any aspect ratio), or oval (with any aspect ratio); the heavy metal or anti-ferromagnetic strip film 1 is rectangle, a top area of the heavy metal or anti-ferromagnetic strip film 1 is larger than a bottom area of the magnetic tunnel junctions B1-BX, a bottom surface of the magnetic tunnel junctions B1-BX is completely confined within a top surface of the heavy metal or anti-ferromagnetic strip film 1.

Figure 3:
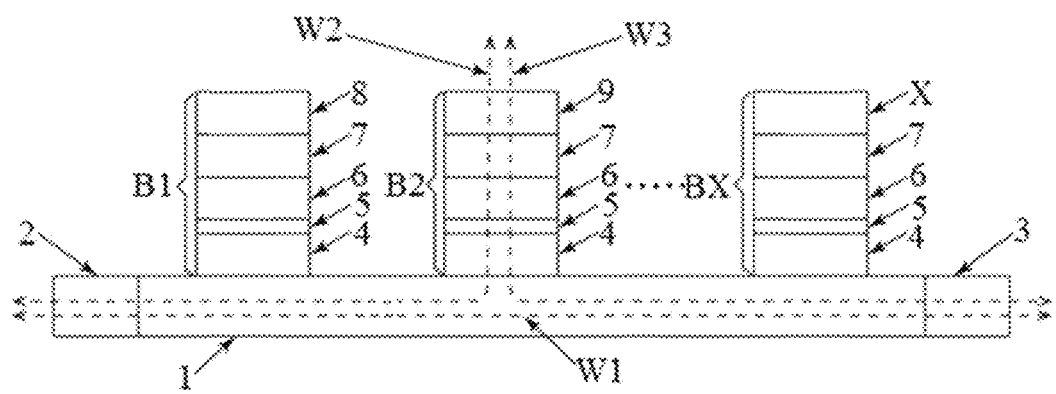
FIG. 3 is a first schematic view of a data writing method of the magnetic memory provided by the present invention.

FIG. 3 is a first schematic view of a data writing method of the magnetic memory provided by the present invention, which shows paths and directions which are able to be used by the write current. Take the write operation of the magnetic tunnel junction B2 as an example.

The write operation is performed through four steps of: (1) applying a current to a branch W1 (which is defined between the first bottom electrode and the second bottom electrode), producing a spin orbit torque, and disturbing magnetization directions of the first ferromagnetic metals 4 of all magnetic tunnel junctions B1-BX, wherein the magnetization directions of first ferromagnetic metals 4 are unable to be switched; (2) applying a current to a branch W2 (which is defined between the first bottom electrode and the second top electrode) or a branch W3 (which is defined between the second bottom electrode and the second top electrode) and producing a spin transfer torque, wherein the magnetization direction of the first ferromagnetic metal 4 of the second magnetic tunnel junction B2 is gradually changed or unchanged, whether the magnetization direction thereof is changed is dependent on both a state of data to be written and a current direction applied to the branch W2 or W3; (3) removing the current of the branch W1, remaining the current of the branch W2 or W3, and continuing to complete reliable data writing through the spin transfer torque; and (4) removing the currents of the branches W2 and W3, wherein the magnetization direction of the first ferromagnetic metal 4 of the second magnetic tunnel junction B2 is switched or unchanged, a resistance of the second magnetic tunnel junction B2 is correspondingly changed or unchanged, resistances of other magnetic tunnel junctions (comprising B1 and BX) are unchanged, and completing the write operation.

Figure 4:
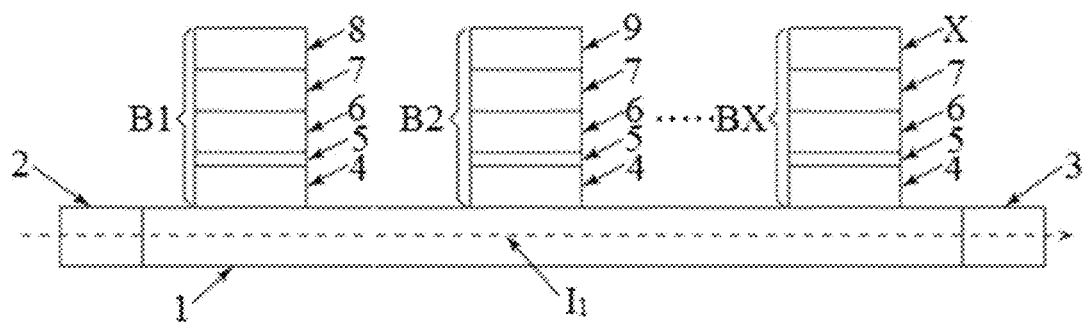
FIG. 4 is a second schematic view of a data writing method of the magnetic memory provided by the present invention, which shows that a current is applied to a heavy metal or anti-ferromagnetic strip film.
Figure 5:
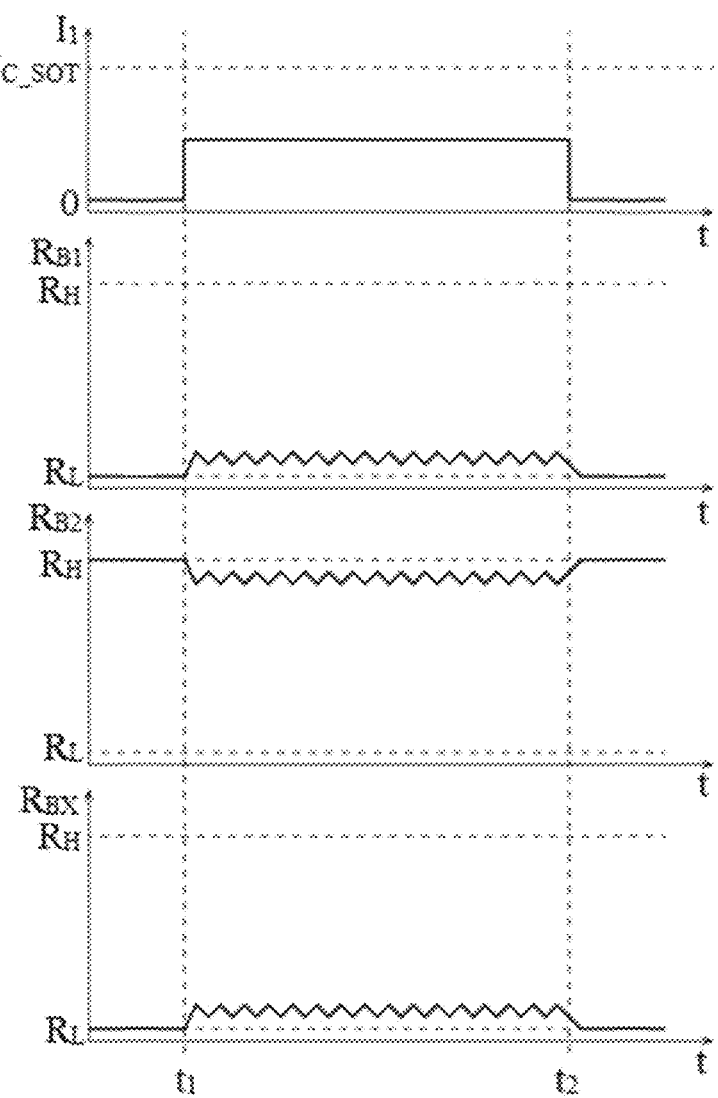
FIG. 5 shows a signal waveform diagram and resistance variation diagrams of the magnetic tunnel junctions in FIG. 4.

FIG. 4 is a second schematic view of a data writing method of the magnetic memory, which shows applying a current between the first bottom electrode 2 and the second bottom electrode 3, wherein the current only passes through the heavy metal or antiferromagnetic strip film 1. FIG. 5 shows a signal waveform diagram and resistance variation diagrams of the magnetic tunnel junctions shown in FIG. 4.

In FIG. 5, at an initial time, the first magnetic tunnel junction B1, the second magnetic tunnel junction B2 and the $X^{th}$ magnetic tunnel junction BX are respectively in low-resistance, high-resistance and low-resistance states; start from time $t_1$, a write current $I_1$ is applied between the first bottom electrode 2 and the second bottom electrode 3, the write current $I_1$ meets $I_1 < I_{C\_SOT}$, resistances of all the magnetic tunnel junctions B1, B2 and BX on the heavy metal or antiferromagnetic strip film 1 start to change slightly; till time $t_2$, the write current $I_1$ is removed, the resistances of all the magnetic tunnel junctions B1, B2 and BX gradually return to initial values thereof, respectively. By the operation shown in FIG. 4, no resistances of all the magnetic tunnel junctions B1, B2 and BX are changed.

Figure 6:
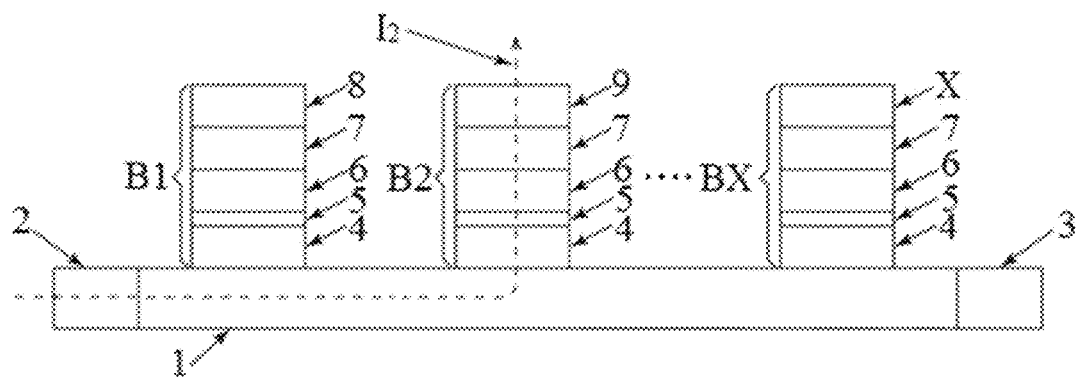
FIG. 6 is a third schematic view of a data writing method of the magnetic memory provided by the present invention, which shows that a current is applied to a magnetic tunnel junction and a part of the heavy metal or anti-ferromagnetic strip film.
Figure 7:
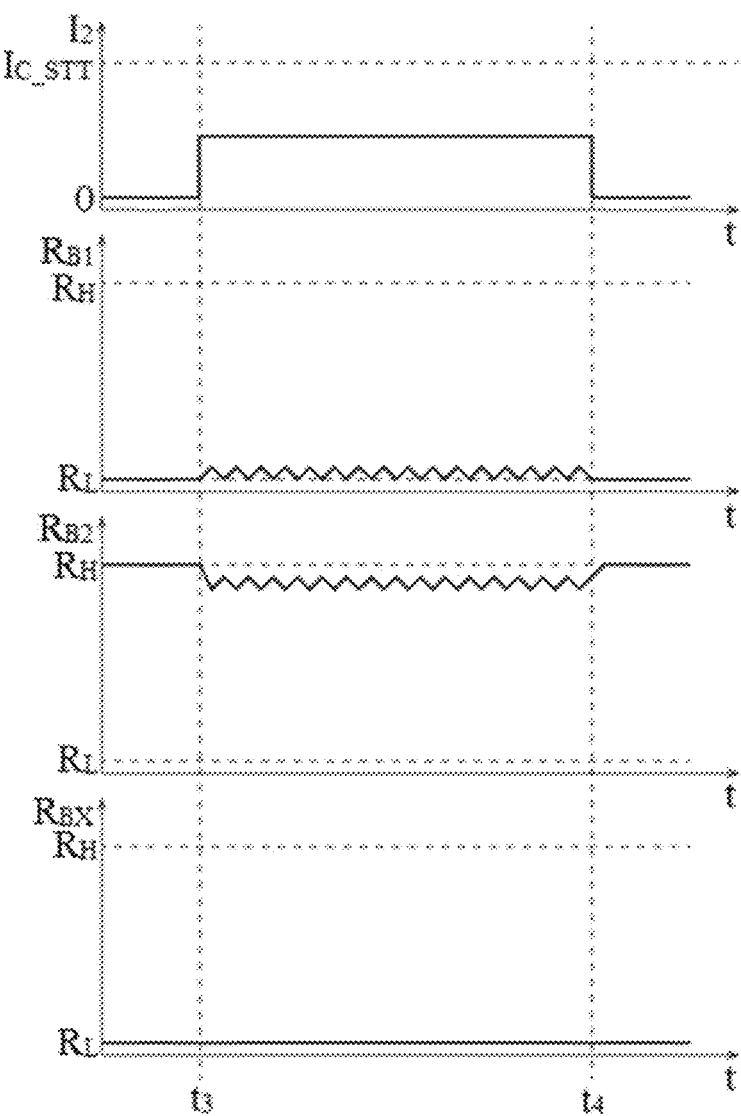
FIG. 7 shows a signal waveform diagram and resistance variation diagrams of the magnetic tunnel junctions in FIG. 6.

FIG. 6 is a third schematic view of a data writing method of the magnetic memory provided by the present invention, which shows a current is applied between the first bottom electrode 2 and the second top electrode 9, wherein the current only passes through the second magnetic tunnel junction B2 and a part of the heavy metal or antiferromagnetic strip film 1. FIG. 7 shows a signal waveform diagram and resistance variation diagrams of the magnetic tunnel junctions shown in FIG. 6.

In FIG. 7, at an initial time, the first magnetic tunnel junction B1, the second magnetic tunnel junction B2 and the $X^{th}$ magnetic tunnel junction BX are respectively in low-resistance, high-resistance and low-resistance states; start from time $t_3$, a write current $I_2$ is applied between the first bottom electrode 2 and the second top electrode 9, the write current $I_2$ meets $I_2 < I_{C\_STT}$, resistances of the first magnetic tunnel junctions B1 and the second magnetic tunnel junctions B2 start to change slightly, and a resistance of the $X^{th}$ magnetic tunnel junction BX is unchanged; till time $t_4$, the write current $I_2$ is removed, the resistances of the first magnetic tunnel junctions B1 and the second magnetic tunnel junctions B2 gradually return to initial values thereof, respectively. By the operation shown in FIG. 6, no resistances of all the magnetic tunnel junctions B1, B2 and BX are changed.

Figure 8:
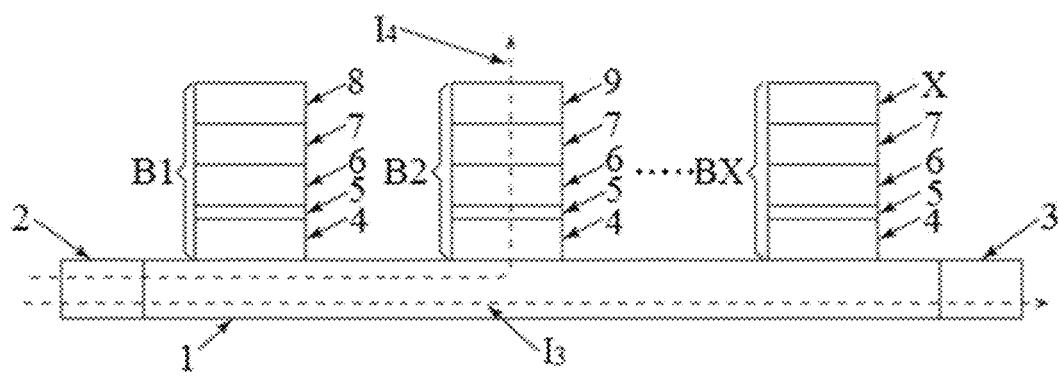
FIG. 8 is a fourth schematic view of a data writing method of the magnetic memory provided by the present invention, which shows a process of switching the magnetic tunnel junction to low-resistance state.
Figure 10:
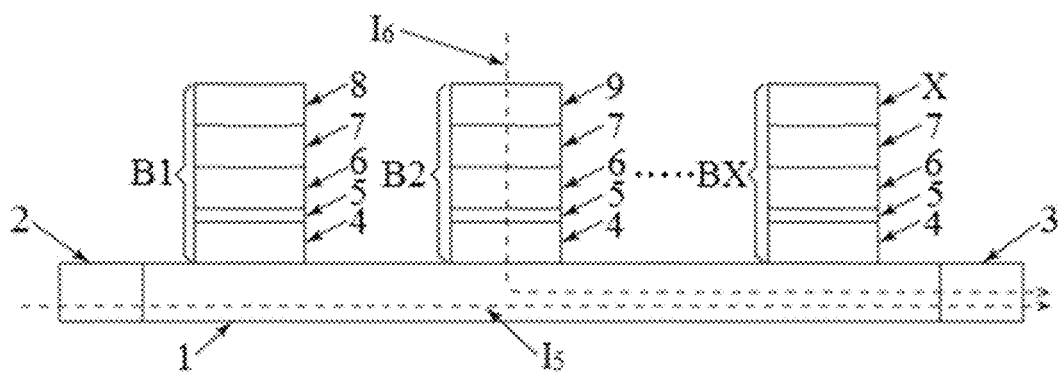
FIG. 10 is a fifth schematic view of a data writing method of the magnetic memory provided by the present invention, which shows a process of switching the magnetic tunnel junction to high-resistance state.

In actual use, the path and direction of the write current are dependent on the state of the data to be written, which will be explained in detail in the following two examples (as shown in FIG. 8 and FIG. 10, respectively).

Figures 1, 9:
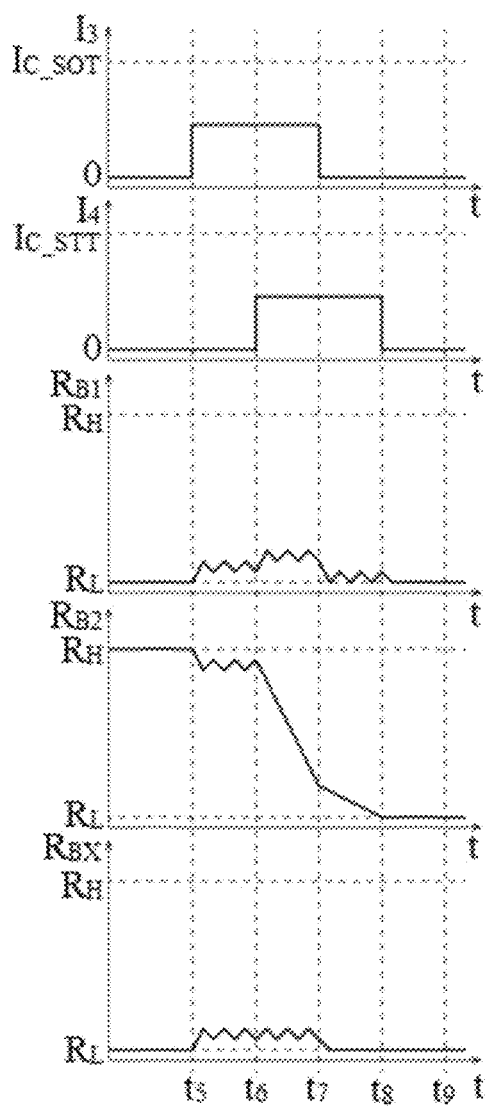
Figures 2, 9:
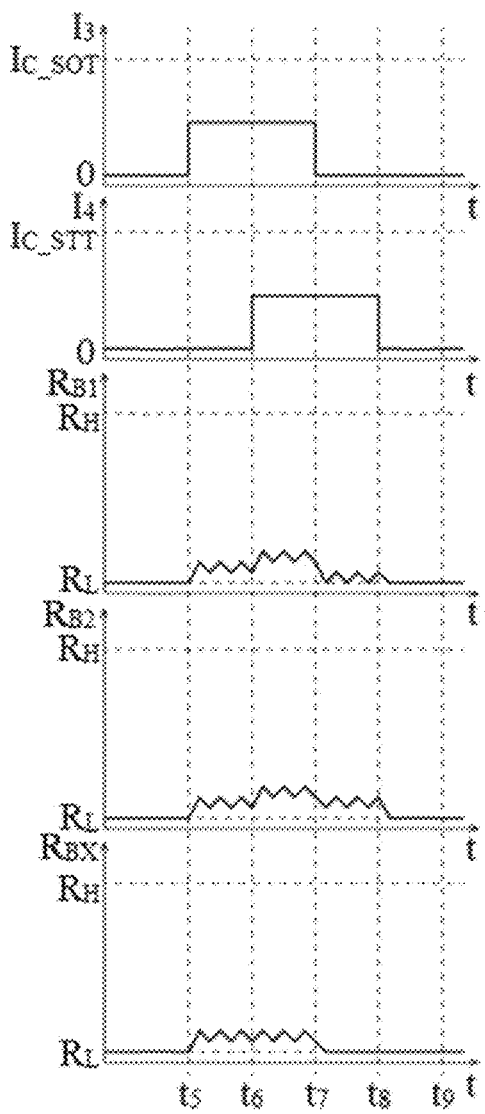

FIG. 8 is a fourth schematic view of a data writing method of the magnetic memory provided by the present invention, which shows the process of switching the second magnetic tunnel junction B2 to low-resistance state. FIGS. 9-1 and 9-2 are signal waveform diagrams and resistance variation diagrams of the magnetic tunnel junction shown in FIG. 8, wherein FIG. 9-1 shows a waveform diagram and resistance variation diagrams of the second magnetic tunnel junction B2 in the high-resistance initial state, and FIG. 9-2 shows a waveform diagram and resistance variation diagrams of the second magnetic tunnel junction B2 in the low-resistance initial state.

In FIGS. 9-1 and 9-2, at an initial time, both the first magnetic tunnel junction B1 and the $X^{th}$ magnetic tunnel junction BX are in the low-resistance state; within time $t_5$-$t_6$, a first step of the write operation is performed, that is, a write current $I_3$ is applied between the first bottom electrode 2 and the second bottom electrode 3, the write current $I_3$ meets $I_3 < I_{C\_SOT}$, resistances of all the magnetic tunnel junctions B1, B2 and BX on the heavy metal or antiferromagnetic strip film 1 change slightly; at this moment, if the write current $I_3$ is removed, the resistances of all the magnetic tunnel junctions B1, B2 and BX gradually return to initial values thereof, respectively;

within time $t_6$-$t_7$, a second step of the write operation is performed, that is, a write current $I_4$ is applied between the first bottom electrode 2 and the second top electrode 9, the write current $I_4$ meets $I_4 < I_{C\_STT}$, resistances of the magnetic tunnel junctions B1 and BX except the second magnetic tunnel junction B2 change slightly, but unable to cause the state to switch, wherein if the initial state of the second magnetic tunnel junction B2 is the high-resistance state, the resistance thereof is gradually decreased (as shown in FIG. 9-1); on the contrary, if the initial state of the second magnetic tunnel junction B2 is the low-resistance state, the resistance thereof changes slightly (as shown in FIG. 9-2);

within time $t_7$-$t_8$, a third step of the write operation is performed, that is, the write current $I_3$ applied between the first bottom electrode 2 and the second bottom electrode 3 is removed, the write current $I_4$ applied between the first bottom electrode 2 and the second top electrode 9 remains unchanged, the resistance of the first magnetic tunnel junction B1 changes slightly, but unable to cause the state to switch, the resistance of the $X^{th}$ magnetic tunnel junction BX returns to the initial value thereof, wherein if the initial state of the second magnetic tunnel junction B2 is the high-resistance state, the resistance thereof is gradually decreased to a minimum value (as shown in FIG. 9-1); on the contrary, if the initial state of the second magnetic tunnel junction B2 is the low-resistance state, the resistance thereof changes slightly (as shown in FIG. 9-2);

within time $t_8$-$t_9$, a fourth step of the write operation is performed, that is, the write current $I_4$ applied between the first bottom electrode 2 and the second top electrode 9 is removed, the resistance of the second magnetic tunnel junction B2 is remained at the minimum value, the resistance of the first magnetic tunnel junction B1 returns to the initial value thereof, the resistance of the $X^{th}$ magnetic tunnel junction BX is remained at the initial value thereof.

Through the four steps mentioned above within time $t_5$-$t_9$, the second magnetic tunnel junction B2 is switched to low-resistance state, and other magnetic tunnel junctions B1 and BX are still in the initial states thereof, respectively.

Figures 1, 11:
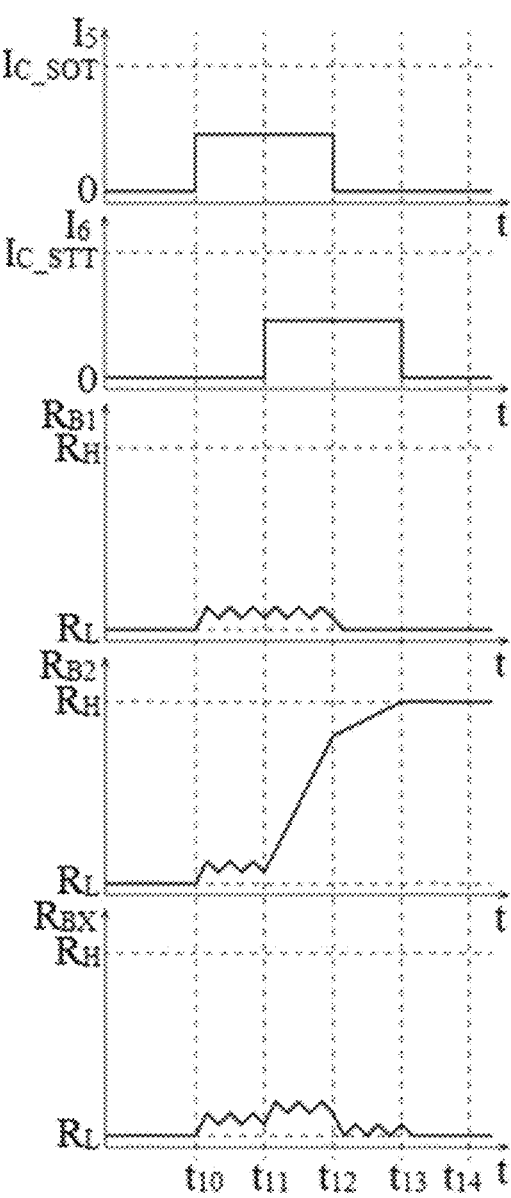
Figures 2, 11:
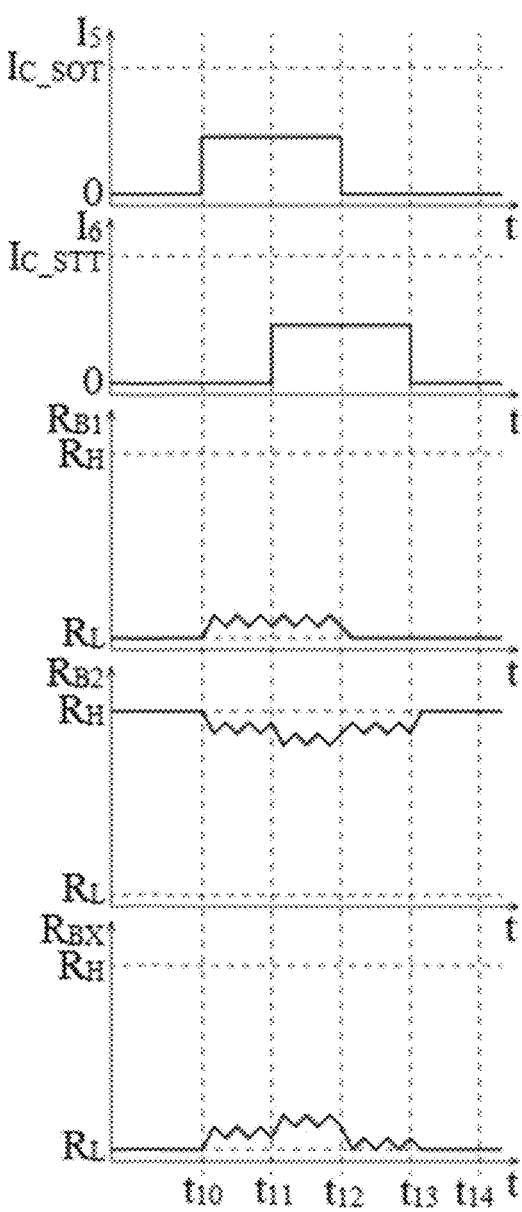

FIG. 10 is a fifth schematic view of a data writing method of the magnetic memory provided by the present invention, which shows the process of switching the second magnetic tunnel junction B2 to high-resistance state. FIGS. 11-1 and 11-2 are signal waveform diagrams and resistance variation diagrams of the magnetic tunnel junction shown in FIG. 10, wherein FIG. 11-1 shows a waveform diagram and resistance variation diagrams of the second magnetic tunnel junction B2 in the low-resistance initial state, and FIG. 11-2 shows a waveform diagram and resistance variation diagrams of the second magnetic tunnel junction B2 in the high-resistance initial state.

In FIGS. 11-1 and 11-2, at an initial time, both the first magnetic tunnel junction B1 and the $X^{th}$ magnetic tunnel junction BX are in the low-resistance state; within time $t_{10}$-$t_{11}$, a first step of the write operation is performed, that is, a write current $I_5$ is applied between the first bottom electrode 2 and the second bottom electrode 3, the write current $I_5$ meets $I_5$<$I_{C\_SOT}$, resistances of all the magnetic tunnel junctions B1, B2 and BX on the heavy metal or antiferromagnetic strip film 1 change slightly; at this moment, if the write current $I_5$ is removed, the resistances of all the magnetic tunnel junctions B1, B2 and BX gradually return to initial values thereof, respectively;

within time $t_{11}$-$t_{12}$, a second step of the write operation is performed, that is, a write current $I_6$ is applied between the second top electrode 9 and the second bottom electrode 3, the write current $I_6$ meets $I_6$<$I_{C\_STT}$, resistances of the magnetic tunnel junctions B1 and BX except the second magnetic tunnel junction B2 change slightly, but unable to cause the state to switch, wherein if the initial state of the second magnetic tunnel junction B2 is the low-resistance state, the resistance thereof is gradually increased (as shown in FIG. 11-1); on the contrary, if the initial state of the second magnetic tunnel junction B2 is the high-resistance state, the resistance thereof changes slightly (as shown in FIG. 11-2);

within time $t_{12}$-$t_{13}$, a third step of the write operation is performed, the write current $I_5$ applied between the first bottom electrode 2 and the second bottom electrode 3 is removed, the write current $I_6$ applied between the second top electrode 9 and the second bottom electrode 3 remains unchanged, the resistance of the first magnetic tunnel junction B1 returns to the initial value thereof; the resistance of the $X^{th}$ magnetic tunnel junction BX changes slightly, but unable to cause the state to switch, wherein if the initial state of the second magnetic tunnel junction B2 is the low-resistance state, the resistance thereof is gradually increased to a maximum value (as shown in FIG. 11-1); on the contrary, if the initial state of the second magnetic tunnel junction B2 is the high-resistance state, the resistance thereof changes slightly (as shown in FIG. 11-2);

within time $t_{13}$-$t_{14}$, a fourth step of the write operation is performed, that is, the write current $I_6$ applied between the second top electrode 9 and the second bottom electrode 3 is removed, the resistance of the second magnetic tunnel junction B2 is remained at the maximum value, the resistance of the first magnetic tunnel junction B1 is remained at the initial value thereof, the resistance of the $X^{th}$ magnetic tunnel junction BX returns to the initial value thereof.

Through the four steps mentioned above within time $t_{10}$-$t_{14}$, the second magnetic tunnel junction B2 is switched to high-resistance state, and other magnetic tunnel junctions (B1 and BX) are still in the initial states thereof, respectively.

What is claimed is:

1. A data writing method of a magnetic memory, wherein the magnetic memory comprises one or more magnetic tunnel junctions, a heavy metal or anti-ferromagnetic strip film, a first bottom electrode and a second bottom electrode, wherein every magnetic tunnel junction is located on the heavy metal or anti-ferromagnetic strip film and represents a memory cell, the first bottom electrode and the second bottom electrode are respectively connected with two ends of the heavy metal or anti-ferromagnetic strip film, every magnetic tunnel junction comprises a first ferromagnetic metal, a first oxide, a second ferromagnetic metal, a first synthetic antiferromagnetic layer and an $X^{th}$ top electrode from bottom to top in sequence, here X is a serial number of the memory cell represented by a corresponding magnetic tunnel junction;

the data writing method is based on a spin orbit torque effect and a spin transfer torque effect and comprises steps of:

(1) applying a current, called as a spin orbit torque write current, between the first bottom electrode and the second bottom electrode, producing a spin orbit torque, disturbing magnetization states of the first ferromagnetic metals of all the magnetic tunnel junctions through the spin orbit torque, wherein the magnetization states are unable to be switched since the spin orbit torque write current is smaller than a switching threshold;

(2) according to a data value to be written, applying a current, called as a spin transfer torque write current, between the first bottom electrode and the $X^{th}$ top electrode, or between the $X^{th}$ top electrode and the second bottom electrode, producing a spin transfer torque, writing the data value based on a magnetization direction of the first ferromagnetic metal of the $X^{th}$ magnetic tunnel junction under an action of the spin transfer torque, wherein a state of the written data value is dependent on a direction of the spin transfer torque write current;

(3) removing the spin orbit torque write current, remaining the spin transfer torque write current, and continuing to complete reliable writing through the remained spin transfer torque write current; and (4) removing the spin transfer torque write current, wherein the magnetization direction of the first ferromagnetic metal of the $X^{th}$ magnetic tunnel junction is changed or unchanged, a resistance of the $X^{th}$ magnetic tunnel junction is correspondingly changed or unchanged, resistances of other magnetic tunnel junctions are unchanged, and completing writing.

2. The data writing method, as recited in claim 1, wherein the spin orbit torque to write current and the spin transfer torque write current are smaller than respective switching thresholds; and are able to be simultaneously adopted to achieve reliable data writing.

3. The data writing method, as recited in claim 1, wherein a resistance of every magnetic tunnel junction is dependent on the magnetization direction of the first ferromagnetic metal and the second ferromagnetic metal; if the magnetization direction of the first ferromagnetic metal is as same as the magnetization direction of the second ferromagnetic metal, the magnetic tunnel junction is in a low-resistance state; conversely, if the magnetization direction of the first ferromagnetic metal is opposite to the magnetization direction of the second ferromagnetic metal, the magnetic tunnel junction is in a high-resistance state.

4. The data writing method, as recited in claim 1, wherein the magnetization direction of the second ferromagnetic metal is pinned, and the magnetization direction of the first ferromagnetic metal is able to be changed through write operations.

* * * * *